United States Patent
Harvey et al.

Patent Number: 6,013,558
Date of Patent: Jan. 11, 2000

[54] SILICON-ENRICHED SHALLOW TRENCH OXIDE FOR REDUCED RECESS DURING LDD SPACER ETCH

[75] Inventors: Ian Robert Harvey, Livermore; Calvin Todd Gabriel, Cupertino; Milind Ganesh Weling, San Jose, all of Calif.

[73] Assignee: VLSI Technology, Inc., San Jose, Calif.

[21] Appl. No.: 08/907,099

[22] Filed: Aug. 6, 1997

[51] Int. Cl.$^7$ .................. H01L 21/76; H01L 21/8238
[52] U.S. Cl. .......................... 438/424; 438/221
[58] Field of Search .................... 438/259, 261, 438/386, 426, 427; 257/316, 321

[56] References Cited

U.S. PATENT DOCUMENTS

| | | | |
|---|---|---|---|
| 4,810,673 | 3/1989 | Freeman | 438/386 |
| 4,835,115 | 5/1989 | Eklund | 437/38 |
| 4,871,689 | 10/1989 | Bergami et al. | 437/67 |
| 5,130,268 | 7/1992 | Liou et al. | 437/67 |
| 5,308,784 | 5/1994 | Kim et al. | 437/67 |
| 5,312,770 | 5/1994 | Pasch | 437/67 |
| 5,315,142 | 5/1994 | Acovic et al. | 257/316 |
| 5,316,965 | 5/1994 | Philipossian et al. | 437/70 |
| 5,346,584 | 9/1994 | Nasr et al. | 156/636 |
| 5,362,668 | 11/1994 | Tasaka | 437/67 |
| 5,362,669 | 11/1994 | Boyd et al. | 437/67 |
| 5,472,904 | 12/1995 | Figura et al. | 438/426 |
| 5,480,832 | 1/1996 | Miura et al. | 437/67 |
| 5,494,846 | 2/1996 | Yamazaki | 437/62 |
| 5,516,625 | 5/1996 | McNamara et al. | 430/314 |
| 5,516,721 | 5/1996 | Galli et al. | 437/67 |
| 5,827,761 | 10/1998 | Fulford, Jr. et al. | 438/306 |
| 5,888,006 | 3/1999 | Lin et al. | 438/424 |

FOREIGN PATENT DOCUMENTS 59181640  10/1984  Japan.

*Primary Examiner*—Olik Chaudhuri
*Assistant Examiner*—Anh Duy Mai
*Attorney, Agent, or Firm*—Woodard, Emhardt, Naughton Moriarty & McNett

[57] ABSTRACT

A method of isolating a semiconductor device by shallow trench isolation is provided by: (a) etching a trench into the surface of an integrated circuit; (b) depositing an oxide in the trench so that at least the upper portion of the oxide is silicon-rich; (c) providing a polysilicon gate electrode on the surface of the integrated circuit, with the gate electrode being provided substantially adjacent to the trench with a space between the trench and the gate electrode; (d) providing a spacer oxide to cover the trench oxide, the gate electrode and the space between the trench and the gate electrode, so that the spacer oxide has near-stoichiometric levels of silicon; and (e) etching the spacer oxide from the surface of the integrated circuit under conditions effective to selectively etch the spacer oxide from the upper surface of the integrated circuit and from the upper surface of the gate electrode without etching the trench oxide from the upper portion of the trench.

5 Claims, 1 Drawing Sheet

SILICON-ENRICHED SHALLOW TRENCH OXIDE FOR REDUCED RECESS DURING LDD SPACER ETCH

FIELD OF THE INVENTION

The present invention relates generally to semiconductor devices, and more particularly to a method of isolating a semiconductor device by shallow trench isolation.

BACKGROUND TO THE INVENTION

Integrated circuits having a plurality of circuit elements on a single chip are commonplace in modern electronic devices. As is known in the art, one important aspect of the design and fabrication of such devices involves the ability to isolate the various elements to prevent interfering interactions between circuit elements on the same chip.

Shallow trench isolation (STI) is one technique for isolating metal-oxide-semiconductor (MOS) devices, and is preferred for certain applications because it results in a nearly flat surface. With STI, a nitride/oxide stack is used to mask the etching of silicon in a trench between devices. The trench is then filled with deposited oxide which is polished flat using a chemical mechanical polishing process. Following STI formation, and appropriate implant steps, a gate electrode is formed with lightly-doped drain (LDD) spacers on it.

In the prior art, the deposited oxide is nominally stoichiometric $SiO_2$.

One problem associated with the prior art is that, at the end of the spacer oxide etch and during any intentional or unintentional overetch, the STI oxide is also exposed to the plasma. Most oxides etch at about the same rate in typical dielectric etch plasma, so the conventional STI fill-oxide accordingly recedes as a result of exposure to the plasma during spacer etch and overetch. See, e.g., FIG. 1, infra. A recess of 200–500 angstroms is typically observed under standard operating conditions, and a recess of that magnitude clearly degrades wafer planarity and compromises the advantages obtained by using STI for isolation.

A need therefore exists for a new technique for STI trench oxide deposition and spacer etch that will greatly reduce this recess. The present invention addresses that need.

SUMMARY OF THE INVENTION

Briefly describing the present invention there is provided a method of isolating a semiconductor device by shallow trench isolation by: (a) providing an isolation trench in the surface of an integrated circuit; (b) depositing a trench oxide in the trench so that at least the upper portion of the trench oxide is silicon-rich; (c) providing a polysilicon gate electrode on the surface of the integrated circuit such that the gate electrode is provided substantially adjacent to the trench with a space between the trench and the gate electrode; (d) providing a spacer oxide to cover the trench oxide, the gate electrode and the space between the trench and the gate electrode, so that the spacer oxide has near-stoichiometric levels of silicon; and (e) etching the spacer oxide from the surface of the integrated circuit under conditions effective to selectively etch the spacer oxide from the upper surface of the integrated circuit and from the upper surface of the gate electrode without etching the trench oxide from the upper portion of the trench.

One object of the present invention is to provide a method for reducing the recess that typically occurs in shallow trench isolation (STI) from spacer oxide etching.

Further objects and advantages of the present invention will be apparent from the following description.

DESCRIPTION OF THE PREFERRED EMBODIMENT

For the purpose of promoting an understanding of the principles of the invention, reference will now be made to preferred embodiments and specific language will be used to describe the same. It will nevertheless be understood that no limitation of the scope of the invention is thereby intended, such alterations and further modifications in the preferred embodiments, and such further applications of the principles of the invention as described herein being contemplated as would normally occur to one skilled in the art to which the invention pertains.

The present invention relates generally to a method of reducing the recess that typically occurs in shallow trench isolation (STI) from spacer oxide etching. The object is achieved generally by using a nonstoichiometric oxide for the STI trench oxide deposition, and more particularly by using a silicon-rich oxide as the trench oxide. When a conventional spacer oxide is used in combination with the silicon-rich trench oxide, the spacer oxide is more easily removed by etching, and the recess normally associated with STI is reduced or eliminated.

The invention is based on the discovery that silicon-rich $SiO_2$ oxides are less easily removed under certain etch conditions than are stoichiometric $SiO_2$ oxides. In fact, under certain etching conditions the etch rate ratio (selectivity) is about 4:1. Accordingly, when the spacer oxide has stoichiometric levels of silicon, such as in conventional LDD spacer oxides, the spacer oxide can be selectively removed by conventional etching techniques if the trench oxide is silicon-rich.

Figure 1A:
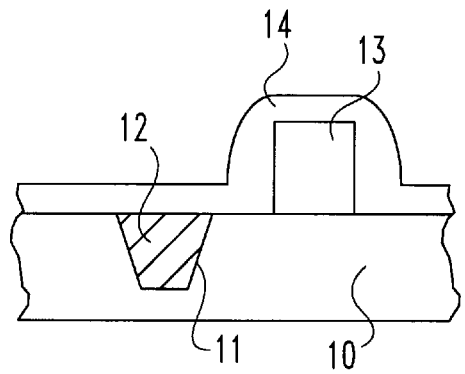
FIGS. 1A–B show the prior art method after LDD spacer oxide deposition (1A) and after LDD spacer etch (1B).
Figure 1B:
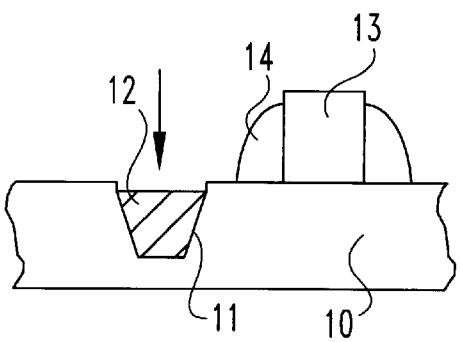
Figure 2A:
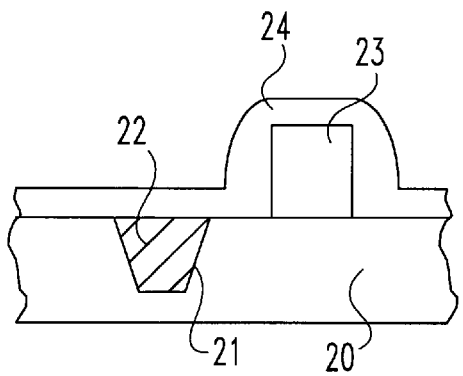
FIGS. 2A–B show the method of the present invention, according to one preferred embodiment, after LDD spacer oxide deposition (2A) and after LDD spacer etch (2B).
Figure 2B:
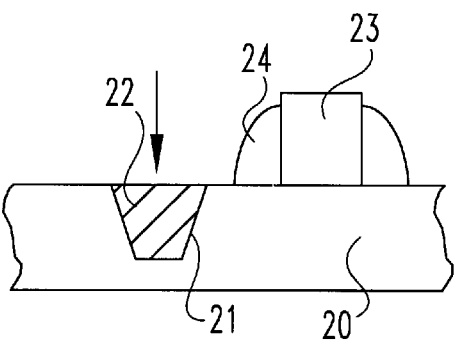

Referring to the Figures, with elements 10–14 relating to FIG. 1 and elements 20–24 relating to FIG. 2, in one preferred embodiment an isolation trench 11/21 is first provided on a silicon substrate 10/20. As is known to the art, isolation trench 11/21 may be provided by etching the substrate with a plasma etching process in which ions or radicals generated by plasma discharge of a fluoride gas collide against the substrate. Most preferably, a reactive ion etching (R.I.E.) process is used in which a bias voltage is generated by applying a high frequency voltage to an electrode on which the silicon substrate is mounted, and the silicon substrate is etched by plasma discharge.

After the trench has been etched it is filled with a deposited oxide 12/22. This trench oxide is deposited according to known techniques, such as by chemical vapor deposition. Most preferably, plasma-enhanced (PE) or high density plasma (HDP) chemical vapor deposition tools are used.

As with conventional $SiO_2$ oxides, the silicon-rich oxide may be deposited using $SiH_4$:$O_2$ (for HDPCVD) or $SiH_4$:$N_2O$ (for PECVD), although of course for silicon-rich oxides the $SiH_4$ ratio is increased above what is normal for stoichiometric oxide. In one preferred embodiment the silicon-rich oxide is deposited using 82:118 sccm $SiH_4$:$O_2$ instead of the 78:118 sccm $SiH_4:O_2$ used for stoichiometric oxides. In other embodiments, ratios of between about 80:118 and about 100:118 sccm $SiH_4:O_2$ are used. In preferred PECVD embodiments, $SiH_4:N_2O$ ratios of between about 300:5000 and about 500:5000 (sccm) are used to provide Si-rich oxide deposition.

In both HDPCVD and PECVD the operational pressure is typically between about 5 and 10 mTorr, with the precise operational parameters being deteminable by persons skilled in the art. Further, it is to be appreciated that with either technique one can hold the $SiH_4$ constant and reduce the amount of $O_2$ or $N_2O$ used.

In the inventive technique, trench oxide 22 may be deposited silicon-rich throughout, or as a series of discrete layers (designed to gain desirable gap-fill and electrical characteristics) with a capping layer of silicon-rich oxide. Similarly, the layers might be phased in stoichiometry from the beginning of the deposition recipe to the end, in order to achieve the desired results. In all embodiments the result is that the upper layer of trench oxide is silicon rich so that the trench oxide is resistant to loss during spacer etch and overetch, and planarity is not degraded. In the prior art technique, trench oxide 12 is not silicon rich at its upper surface.

After the oxide is deposited in the trench it is polished flat, preferably using a chemical mechanical polishing (CMP) process.

Following STI formation and appropriate implant steps, a gate electrode 13/23 is provided on the surface of the substrate. The gate electrode, which is preferably a polysilicon gate electrode, is provided according to conventional techniques which are well known to the art.

The gate electrode is provided on the silicon substrate at a location which is generally adjacent to the isolation trench. In preferred embodiments a space of about 2000 angstroms is provided between the gate electrode and the isolation trench.

The gate electrode is provided with a LPCVD spacer oxide on it. As is known to the art, the spacer oxide 14/24 is provided to the substrate surface by conventional spacer deposition techniques. In the inventive technique the spacer oxide is provided such that its etch rate is faster than the etch rate of the upper portion of the trench oxide. For example, the spacer oxide may include stoichiometric amounts of silicon (in the $SiO_2$) while the upper portion of the trench oxide is silicon-rich.

The spacer oxide is etched from the surface of the substrate until the surface of the gate electrode is reached and slightly recessed relative to the top surface of the gate electrode. As is known to the art, plasma etching is preferably used for the spacer oxide etch.

The silicon-rich upper portion of the trench oxide protects that oxide from being etched away during the spacer etch. Thus, the present invention provides a method for isolating a semiconductor device so that a flat (or essentially flat) surface is obtained. This is a significant improvement over the prior art in which trench recesses of up to 500 angstroms were observed.

Reference will now be made to specific examples using Lhe processes described above. It is to be understood that the examples are provided to more completely describe preferred embodiments, and that no limitation to the scope of the invention is intended thereby.

EXAMPLE 1

An isolation trench is provided on the surface of a MOS device by etching the trench in the silicon surface of the device. The trench is filled with silicon-rich $SiO_2$ as a trench oxide using 82:118 sccm $SiH_4:O_2$. A gate electrode is then formed on the surface near the trench, and is covered by an LDD spacer oxide consisting of stoichiometric $SiO_2$.

A Lam Research Corp. 4520XL oxide etch tool is used to selectively etch the spacer oxide from the surface of the device, using 2 sccm $CF_4$/2 sccm C 4F8/175 sccm CO as the feed gas mix. The spacer oxide etches rapidly down to the top of the gate electrode and to the top of the trench, but the trench oxide does not etch away due to its silicon-rich composition. The surface of the semiconductor is flat over the isolation trench.

While the invention has been illustrated and described in detail in the drawing and foregoing description, the same is to be considered as illustrative and not restrictive in character, it being understood that only the preferred embodiment has been shown and described and that all changes and modifications that come within the spirit of the invention are desired to be protected.

We claim:

1. A method of isolating a semiconductor device by shallow trench isolation, the method comprising:
   (a) etching a trench into the surface of an integrated circuit;
   (b) depositing an oxide in said trench, wherein at least the upper portion of said oxide is silicon-rich;
   (c) providing a gate electrode on the surface of the integrated circuit, wherein said gate electrode is provided substantially adjacent to said trench, with a space between the trench and the gate electrode;
   (d) providing a spacer oxide to cover said trench oxide, said gate electrode, and said space between said trench and said gate electrode, wherein said spacer oxide has near-stoichiometric levels of silicon;
   (e) etching the spacer oxide from the surface of the integrated circuit under conditions effective to selectively etch the spacer oxide from the upper surface of the integrated circuit and from the upper surface of the gate electrode without etching the trench oxide from the upper portion of the trench.

2. The method of claim 1 wherein said spacer oxide etching is selectively etched at a rate of at least 4:1 when compared to the etch rate of the trench oxide.

3. The method of claim 1 wherein said trench oxide is deposited as a series of discrete layers, the uppermost of which is silicon-rich.

4. The method of claim 1 wherein said trench oxide is deposited using an excess of $SiH_4$.

5. The method of claim 1 wherein said spacer etching is performed until the uppermost portion of the trench oxide is substantially level with the uppermost portion of the trench.

* * * * *

UNITED STATES PATENT AND TRADEMARK OFFICE
CERTIFICATE OF CORRECTION

PATENT NO : 6,013,558
DATED : January 11, 2000
INVENTOR(S) : Harvey et al.

It is certified that errors appear in the above-identified patent and that said Letters Patent are hereby corrected as shown below:

In column 3, line 62, please change "Lhe" to --the--.

In column 4, line 15, please change "C4F8" to --$C_4F_8$--.

Signed and Sealed this

First Day of May, 2001

Attest:

NICHOLAS P. GODICI

Attesting Officer

Acting Director of the United States Patent and Trademark Office